United States Patent
Murakami et al.

(10) Patent No.: US 11,623,893 B2
(45) Date of Patent: Apr. 11, 2023

(54) SURFACE-COATED CUTTING TOOL IN WHICH HARD COATING LAYER EXHIBITS EXCEPTIONAL WELDING RESISTANCE, PLASTIC DEFORMATION RESISTANCE, AND ANOMALOUS DAMAGE RESISTANCE

(71) Applicant: MITSUBISHI MATERIALS CORPORATION, Tokyo (JP)

(72) Inventors: Akihiro Murakami, Naka (JP); Masaki Okude, Naka (JP); Shin Nishida, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 17/283,744

(22) PCT Filed: Oct. 11, 2019

(86) PCT No.: PCT/JP2019/040214
§ 371 (c)(1),
(2) Date: Apr. 8, 2021

(87) PCT Pub. No.: WO2020/075840
PCT Pub. Date: Apr. 16, 2020

(65) Prior Publication Data
US 2021/0380489 A1    Dec. 9, 2021

(30) Foreign Application Priority Data

Oct. 11, 2018 (JP) .............................. JP2018-192796
Sep. 30, 2019 (JP) .............................. JP2019-180517

(51) Int. Cl.
*C04B 35/58* (2006.01)
*C04B 35/622* (2006.01)
(Continued)

(52) U.S. Cl.
CPC ...... *C04B 35/58021* (2013.01); *B23B 27/148* (2013.01); *C04B 35/58035* (2013.01);
(Continued)

(58) Field of Classification Search
CPC .................. B23B 27/14; B23B 27/148; B23B 2228/10; C23C 16/36; C04B 35/58021;
(Continued)

(56) References Cited

U.S. PATENT DOCUMENTS 5,223,337 A * 6/1993 van den Berg ........ G11B 23/20
51/307
5,232,318 A * 8/1993 Santhanam ............. C23C 16/36
407/119

(Continued)

FOREIGN PATENT DOCUMENTS

JP       07-252579 A    10/1995
JP       2004-074300 A  3/2004
(Continued)

OTHER PUBLICATIONS

International Search Report dated Nov. 26, 2019 for the corresponding PCT International Patent Application No. PCT/JP2019/040214.

Primary Examiner — Humera N. Sheikh
Assistant Examiner — Katherine A Christy
(74) Attorney, Agent, or Firm — Leason Ellis LLP

(57) ABSTRACT

A surface-coated cutting tool according to the present invention includes a tool body and a hard coating layer including a complex carbonitride layer containing a small amount of chlorine and $(Ti_{(1-x)}Zr_{x,y}Hf_{x(1-y)})(N_{(1-z)}C_z)$ ($0.10 \leq x \leq 0.90$, $0 < y \leq 1.0$, $0.08 < z < 0.60$), a ZrHf and C content ratios in cycles, a cycle distance between a maximum ZrHf content point and an adjacent minimum ZrHf content point and a cycle distance between a maximum C content point and an adjacent minimum C content point are 5 to 100 nm, an
(Continued)

average value of content ratio differences $\Delta x$ and $\Delta z$ is 0.02 or more, a distance between the maximum ZrHf content point and the maximum C content point is ⅕ or less of the distance between a maximum content point and a minimum content point of adjacent ZrHf components, and a composition fluctuation structure is 10% or more.

2 Claims, 2 Drawing Sheets

(51) Int. Cl.
    *C23C 16/36*     (2006.01)
    *B23B 27/14*     (2006.01)

(52) U.S. Cl.
    CPC ........ *C04B 35/62222* (2013.01); *C23C 16/36* (2013.01); *B23B 2228/10* (2013.01); *C04B 2235/3856* (2013.01); *C04B 2235/3886* (2013.01)

(58) Field of Classification Search
    CPC ........ C04B 35/58035; C04B 35/62222; C04B 2235/3856; C04B 2235/3886
    USPC ........................................ 428/697, 698, 699
    See application file for complete search history.

(56) References Cited

U.S. PATENT DOCUMENTS

| | | | |
|---|---|---|---|
| 2015/0336176 A1* | 11/2015 | Bjormander | C23C 16/403 407/115 |
| 2016/0208379 A1* | 7/2016 | Satoh | C23C 16/34 |
| 2019/0358711 A1* | 11/2019 | Ishigaki | C23C 28/042 |

FOREIGN PATENT DOCUMENTS

| | | |
|---|---|---|
| JP | 2004-074302 A | 3/2004 |
| JP | 2004-154878 A | 6/2004 |
| JP | 4028891 B | 12/2007 |
| JP | 4761335 B | 8/2011 |

* cited by examiner

SURFACE-COATED CUTTING TOOL IN WHICH HARD COATING LAYER EXHIBITS EXCEPTIONAL WELDING RESISTANCE, PLASTIC DEFORMATION RESISTANCE, AND ANOMALOUS DAMAGE RESISTANCE

CROSS-REFERENCE TO RELATED PATENT APPLICATIONS

This application is a U.S. National Phase Application under 35 U.S.C. § 371 of International Patent Application No. PCT/JP2019/040214 filed on Oct. 11, 2019 and claims the benefit of priority to Japanese Patent Applications No. 2018-192796 filed Oct. 11, 2018 and No. 2019-180517 filed Sep. 30, 2019, the contents of all of which are incorporated herein by reference in their entireties. The International Application was published in Japanese on Apr. 16, 2020 as International Publication No. WO/2020/075840 under PCT Article 21(2).

FIELD OF THE INVENTION

The present invention relates to a surface-coated tool in which a hard coating layer exhibits exceptional welding resistance, plastic deformation resistance, and anomalous damage resistance during high feed cutting of, for example, precipitation hardening stainless steel during which high impact loads are exerted on a cutting edge, and exceptional cutting performance is exhibited during long-term use.

BACKGROUND OF THE INVENTION

In the related art, in general, in various cutting of steel, a coated tool in which a hard coating layer including a Ti compound layer such as Ti carbonitride (TiCN) layer formed by chemical vapor deposition as a lower layer, and an aluminum oxide layer formed by chemical vapor deposition as an upper layer is formed on a surface of a cemented carbide body such as tungsten carbide base, has been used.

However, in recent years, it is required to achieve high efficiency in cutting of various steels, and in the cutting of the precipitation hardening stainless steel, it is required to achieve the high feed cutting, while, in the coated tool of the related art, welding chipping easily occurs, and even in a case where the welding chipping does not occur and normal wear occurs, the normal wear rapidly proceeds. Accordingly, the performance in the high feed cutting conditions was not sufficient.

For example, Japanese Patent No. 4761335 (B) proposes a coated cutting tool containing a TiZr carbonitride film on a tool body surface, in which the film contains 0.3 mass % or more and 30 mass % or less of Zr and 0.1 mass % or more and 2 mass % or less of chlorine, a residual tensile stress is realized, and a high film hardness, exceptional wear resistance, and exceptional cutting durability during the cutting of steels for a mechanical structure are obtained.

Further, Japanese Patent No. 4028891 (B) proposes a coated cutting tool including a TiZr complex carbonitride film layer having a face-centered cubic structure or a TiHf complex carbonitride film layer having a face-centered cubic structure having a specific component composition and a specific lattice constant as a coating layer with respect to a base material composed of a hard metal or a cermet, exceptional wear resistance is exhibited and a cutting length is long during cutting of cast steel or heat treated steel, and a tool life is improved during long-term use.

CITATION LIST

Patent Documents

[Patent Document 1]
  Japanese Patent No. 4761335 (B)
[Patent Document 2]
  Japanese Patent No. 4028891 (B)

Technical Problem

There has been a strong demand for power saving and energy saving during cutting in recent years. In accordance with this, a coated tool is used under severer conditions. Therefore, for example, it is required to exhibit exceptional welding resistance, plastic deformation resistance, and anomalous damage resistance during high feed cutting of precipitation hardening stainless steel.

However, even in a case where the coated tool formed of a coating layer including the TiZr carbonitride film or the TiHf carbonitride film proposed in Japanese Patent No. 4761335 (B) and Japanese Patent No. 4028891 (B) is used in the high feed cutting of the precipitation hardening stainless steel, minute chipping still easily occurs, and the welding resistance is not sufficient, thereby causing frequent occurrence of welding chipping. Accordingly, there is a problem that the coated tool is not suitable for the high feed cutting of the precipitation hardening stainless steel in practice.

SUMMARY OF THE INVENTION

Solution to Problem

Therefore, the inventors conducted intended studies from the above viewpoint, the coated tool became to have exceptional welding resistance, plastic deformation resistance and anomalous damage resistance over a long period of use, even when the coated tool is used for high feed cutting of precipitation hardening stainless steel. Through these studies, the inventors of the present invention found the followings.

That is, the inventors of the present invention found that the problem of the welding chipping that occurred in the high feed cutting of the precipitation hardening stainless steel can be solved, by increasing welding resistance by obtaining a hard coating layer including a TiZr complex carbonitride layer or a TiZrHf complex carbonitride layer with no brittleness and having exceptional lubricity by adding an extremely small amount of chlorine to the TiZr complex carbonitride layer or the TiZrHf complex carbonitride layer in the hard coating layer, and by increasing a ratio of an N content to a C content of TiZr complex carbonitride or TiZrHf complex carbonitride in the TiZr complex carbonitride layer or the TiZrHf complex carbonitride layer.

In addition, it is found that a hard coating layer in which plastic deformation resistance is exhibited and exceptional anomalous damage resistance is obtained to solve the problem regarding anomalous damage, is obtained by the following. The TiZr complex carbonitride layer or the TiZrHf complex carbonitride layer has a composition fluctuation structure in which a content ratio of a total content of Zr and Hf in a total content of Ti, Zr, and Hf (hereinafter, also referred to as a "ZrHf content ratio") and a content ratio of a C content in a total content of N and C (hereinafter, also referred to as a "C content ratio") change in cycles, the composition fluctuation structure, in response to the composition fluctuation of the ZrHf content ratio and the content ratio of C content, has a composition fluctuation structure in which a content ratio of a Ti content in a total content of Ti, Zr, and Hf (hereinafter, also referred to as a "Ti content ratio") and a content ratio of an N content in a total content of N and C (hereinafter, also referred to as an "N content ratio") change in cycles, particularly, cycles and positions of a maximum ZrHf content point showing a maximum content ratio and a minimum ZrHf content point showing a minimum content ratio of the ZrHf content ratio are respectively synchronized with cycles and positions of a maximum C content point showing a maximum content ratio and a minimum C content point showing a minimum content ratio of the C content ratio, to obtain a structure containing high-hardness crystal grains.

In addition, it is found that, since the coated cutting tool including the complex carbonitride layer as the hard coating layer has exceptional welding resistance, plastic deformation resistance, and anomalous damage resistance, the tool life is improved during long-term use for the high feed cutting of the precipitation hardening stainless steel.

The TiZr complex carbonitride and the TiZrHf complex carbonitride according to the present invention have a higher ratio of the N content to the C content, compared to TiZr complex carbonitride and TiZrHf complex carbonitride of the related art. Accordingly, in the specification, these may be expressed as TiZrNC and TiZrHfNC, respectively.

The present invention has been made based on the above findings.

"(1) A surface-coated cutting tool including a tool body and a hard coating layer on a surface of the tool body, in which (a) the hard coating layer includes at least one layer of a TiZr complex carbonitride layer or a TiZrHf complex carbonitride layer having an average layer thickness of 0.5 to 20.0 μm, (b) the complex carbonitride layer contains TiZr complex carbonitride or TiZrHf complex carbonitride, and in a case where the complex carbonitride is represented by a composition formula $(Ti_{(1-x)}Zr_{xy}Hf_{x(1-y)})(N_{(1-z)}C_z)$, the complex carbonitride layer has an average composition in which a content ratio x of a total content of Zr and Hf to a total content of Ti, Zr, and Hf, a content ratio y of a Zr content to the total content of Zr and Hf, and a content ratio z of a C content to a total content of N and C (here, all of x, y, and z are atomic ratios) satisfy $0.10 \leq x \leq 0.90$, $0 < y \leq 1.0$, and $0.08 < z < 0.60$, respectively, the complex carbonitride layer contains chlorine in an average chlorine content of 0.001 atom % or more and 0.030 atom % or less, (c) the complex carbonitride layer has a composition fluctuation structure in which the content ratio of the total content of Zr and Hf to the total content of Ti, Zr, and Hf and the content ratio of the C content to the total content of N and C change in cycles in at least some crystal grains, (c-1) in longitudinal cross section observation, an area ratio of the composition fluctuation structure occupying a structure of the complex carbonitride layer is 10% or more, (c-2) regarding the content ratio of the total content of Zr and Hf to the total content of Ti, Zr, and Hf in the composition fluctuation structure, a maximum ZrHf content point showing a maximum content ratio $x_{max}$ and a minimum ZrHf content point showing a minimum content ratio $x_{min}$ are repeated, an average distance which is an average value of distances between the repeated maximum ZrHf content point and the minimum ZrHf content point adjacent to each other is 5 to 100 nm, and an average value of absolute values of differences $\Delta x$ between the maximum content ratio $x_{max}$ of the maximum ZrHf content point and the minimum content ratio $x_{min}$ of the minimum ZrHf content point is 0.02 or more, (c-3) regarding the content ratio of the C content to the total content of N and C in the composition fluctuation structure, a maximum C content point showing a maximum content ratio $z_{max}$ and a minimum C content point showing a minimum content ratio $z_{min}$ are repeated, an average distance which is an average value of distances between the repeated maximum C content point and the minimum C content point adjacent to each other is 5 to 100 nm, and an average value of absolute values of differences $\Delta z$ between the maximum content ratio $z_{max}$ of the maximum C content point and the minimum C content ratio $z_{min}$ is 0.02 or more, and (c-4) cycles and positions of the maximum ZrHf content point showing the maximum content ratio $x_{max}$ and the minimum ZrHf content point showing the minimum content ratio $x_{min}$, regarding the content ratio of the total content of Zr and Hf to the total content of the Ti, Zr, and Hf in the composition fluctuation structure, are respectively synchronized with cycles and positions of the maximum C content point showing the maximum content ratio $z_{max}$ and the minimum C content point showing the minimum content ratio $z_{min}$, regarding the content ratio of the C content to the total content of N and C, and an average value of a distances between the maximum ZrHf content point and the maximum C content point at a position closest to the maximum ZrHf content point is ⅕ or less of the average distance between the maximum ZrHf content point and the adjacent minimum ZrHf content point.

(2) The surface-coated cutting tool according to (1), in which the composition fluctuation structure is a laminated structure."

In the present specification, in a case where "to" is used to indicate a numerical range, it means that a lower limit and an upper limit of numerical value are included.

Advantageous Effects of Invention

In the surface-coated cutting tool according to the present invention, the hard coating layer formed on the surface of the tool body includes the TiZr complex carbonitride layer or the TiZrHf complex carbonitride layer, exceptional lubricity is exhibited with no brittleness by adding an extremely small amount of chlorine to the TiZr complex carbonitride layer or the TiZrHf complex carbonitride layer, and the welding resistance is enhanced by increasing the ratio of the N content to the C content. Accordingly, the problem of the welding chipping that occurred during the high feed cutting of the precipitation hardening stainless steel is be solved.

In addition, the TiZr complex carbonitride layer or the TiZrHf complex carbonitride layer contains high-hardness crystal grains having the composition fluctuation structure in which the ZrHf content ratio and the C content ratio change in cycles, and particularly, the cycles and the positions of the maximum ZrHf content point and the minimum ZrHf content point are respectively synchronized with the cycles and the positions of the maximum C content point and the minimum C content point. Accordingly, exceptional plastic deformation resistance is exhibited and the problem of anomalous damage is solved.

Further, since the coated cutting tool including the complex carbonitride layer as the hard coating layer has exceptional welding resistance, plastic deformation resistance, and anomalous damage resistance, the tool life is improved during long-term use for the high feed cutting of the precipitation hardening stainless steel.

BRIEF DESCRIPTION OF THE DRAWINGS

In FIG. 1, in a white frame portion of the cross-sectional HAADF-STEM image of the TiZr complex carbonitride layer of the coated tool 5 of the present invention, a direction in which cycle widths of cyclic composition changes of Ti and Zr are minimized, particularly, a direction in which a layer thickness of a layer configuring a laminated structure is minimized, in a case where the composition fluctuation structure formed in the crystal grains is a structure having the laminated structure, can be obtained. Next, by performing a line analysis by EDS in the "direction in which the cycle widths of the cyclic composition changes of Ti and Zr are minimized", a Zr maximum content ratio, a Zr minimum content ratio, a maximum C content ratio, a minimum C content ratio, a distance between a Zr maximum content point and a Zr minimum content point, a distance between a maximum C content point and a minimum C content point, and a distance between the Zr maximum content point and a maximum C content point at a position closest to the Zr maximum content point were measured.

DETAILED DESCRIPTION OF THE INVENTION

Figure 1:
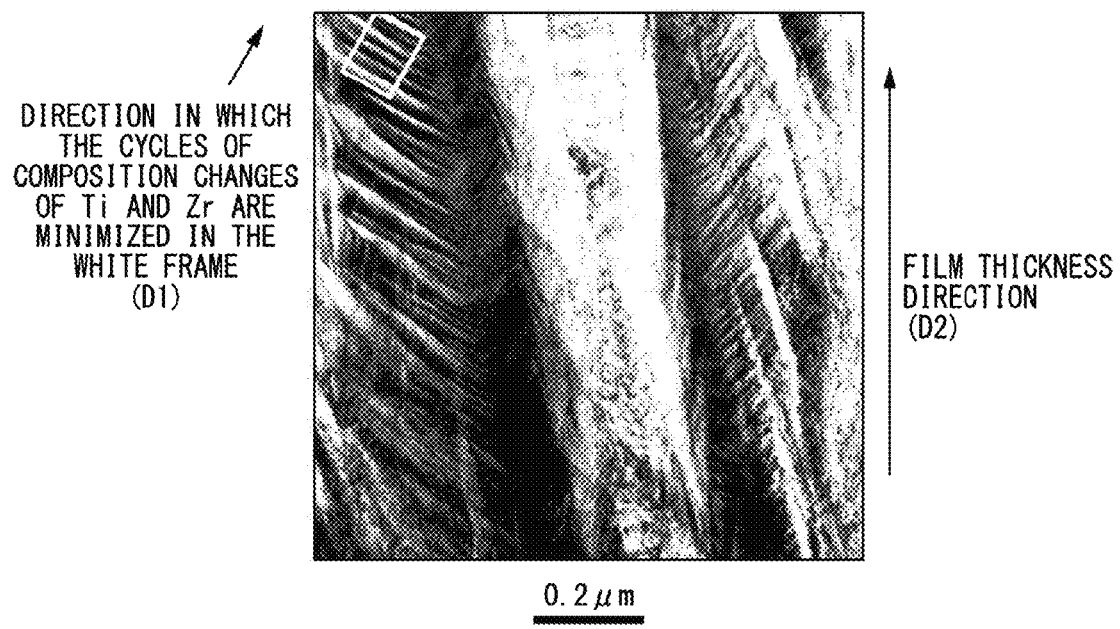
FIG. 1 shows a cross-sectional HAADF-STEM image of a TiZr complex carbonitride layer of a coated tool 5 of the present invention.

Next, a coated tool of the present invention will be described in detail.

Tool body;

For a tool body, any materials can be used, as long as it is a well-known material of the related art as this type of tool body and it does not hinder from achieving the object of the present invention.

The tool body is preferably, for example, any of cemented carbide (WC-based cemented carbide, a material containing Co in addition to WC or to which carbonitride of Ti, Ta, or Nb is added), cermet (material containing TiC, TiN, or TiCN as a main component), or ceramics (titanium carbide, silicon carbide, silicon nitride, aluminum nitride, or aluminum oxide).

Hard coating layer;

A hard coating layer according to the present invention includes at least a complex carbonitride layer, and the complex carbonitride layer includes a TiZr complex carbonitride layer or a TiZrHf complex carbonitride layer.

In addition, the hard coating layer can be provided with, as other layers, an intermediate layer or a lower layer between the tool body and the complex carbonitride layer or provided with an upper layer on the complex carbonitride layer.

Here, in a case where an average layer thickness of the hard coating layer is less than 0.5 µm, wear resistance during long-term use cannot be exhibited, and on the other hand, in a case where the average layer thickness thereof exceeds 30.0 µm, fracture or chipping easily occurs in the entire area of the hard coating layer. Accordingly, the average layer thickness thereof is preferably 0.5 to 30.0 µm.

The average layer thickness of the hard coating layer can be measured using, for example, a scanning electron microscope (SEM) or a transmission electron microscope (TEM) in a cross section orthogonal to the tool body.

Complex carbonitride layer;

(1) Component Composition, Average Layer Thickness

The complex carbonitride layer according to the present invention is composed of the TiZr complex carbonitride layer or the TiZrHf complex carbonitride layer, and in a case where the TiZr complex carbonitride or TiZrHf complex carbonitride configuring the complex carbonitride layer is represented by a composition formula $(Ti_{(1-x)}Zr_{xy}Hf_{x(1-y)})(N_{(1-z)}C_z)$, $0.10 \leq x \leq 0.90$, $0 < y \leq 1.0$, and $0.08 < z < 0.60$ are satisfied, respectively.

Here, x represents an average content ratio of a total content of Zr and Hf to a total content of Ti, Zr, and Hf, and y represents an average content ratio of a Zr content to the total content of Zr and Hf. In addition, z represents an average content ratio of a C content to a total content of N and C. Here, x, y, and z are all atomic ratios.

In the TiZr complex carbonitride layer or the TiZrHf complex carbonitride layer according to the present invention, regarding N which is an element for improving the welding resistance and C which is an element for improving hardness, the content ratio z of C is contained to satisfy $0.08 < z < 0.60$. Accordingly, the hard coating layer having exceptional both properties of high welding resistance and high hardness can be obtained.

In a case where x is smaller than 0.10 or x is larger than 0.90, sufficient lattice strain is not introduced, and sufficient hardness cannot be ensured. Therefore, $0.10 \leq x \leq 0.90$ was specified.

In addition, since the complex carbonitride layer contains an extremely small amount of chlorine in 0.001 to 0.030 atom %, a lubricating effect is exhibited. Accordingly, it is possible to reduce heat generation due to wear during cutting.

Here, the atom % of chlorine in the complex carbonitride layer refers to atom % of chlorine (Cl) of the complex carbonitride layer in a total content of Ti, Zr, Hf, N, O (the complex carbonitride layer can contain 1.5 atom % or less oxygen as inevitable impurities), and Cl. In a case where the atom % thereof is less than 0.001 atom %, the lubricating effect cannot be exhibited, and in a case where the atom % thereof exceeds 0.030 atom %, it may cause brittleness of the coating layer. Accordingly, the atom % is specified as 0.001 to 0.030 atom %.

In addition, in a case where an average layer thickness of the complex carbonitride layer is less than 0.5 µm, wear resistance during long-term use cannot be exhibited, and on the other hand, in a case where the average layer thickness thereof exceeds 20.0 µm, fracture or chipping easily occurs. Accordingly, the average layer thickness thereof is set to 0.5 to 20.0 µm to exhibit exceptional effects in viewpoints of hardness and wear resistance.

(2) Crystal Grains Having Composition Fluctuation Structure

The complex carbonitride (TiZrNC or TiZrHfNC) layer according to the present invention contains crystal grains having a composition fluctuation structure in which the ZrHf content ratio, the Ti content ratio, the C content ratio, and the N content ratio change in cycles.

1) Definitions of maximum ZrHf content point, maximum ZrHf content ratio ($x_{max}$), minimum ZrHf content point, and minimum ZrHf content ratio ($x_{min}$);

In the composition fluctuation structure, the ZrHf content ratio has, for example, a predetermined distance of maximum ZrHf content ratio-minimum ZrHf content ratio-maximum ZrHf content ratio-minimum ZrHf content ratio . . . along a direction in which a cycle width of the cyclic composition change of the ZrHf content ratio is minimized, and shows a cyclic change of the content ratio.

To describe the maximum ZrHf content ratio ($x_{max}$) and the minimum ZrHf content ratio ($x_{min}$) herein, the maximum ZrHf content ratio ($x_{max}$) means a maximum value of the ZrHf content ratio in a region where the ZrHf content ratio at each measurement point is continuously equal to or greater than a value of the average ZrHf content ratio $x_{av}$ of the total content of Zr and Hf to the total content of Ti, Zr, and Hf in the composition formula $(Ti_{(1-x)}Zr_{xy}Hf_{x(1-y)})(N_{(1-z)}C_z)$ of the entire layer. In a case where there are a plurality of regions where the ZrHf content ratio is continuously equal to or greater than the value of the average ZrHf content ratio $x_{av}$, a maximum value of the ZrHf content ratio in each region is defined as the maximum ZrHf content ratio, and a position of each region where the ZrHf content ratio is the maximum value is defined as the maximum ZrHf content point in each region. Hereinafter, the maximum ZrHf content ratio may be referred to as $x_{max}$.

In the same manner as described above, the minimum ZrHf content ratio ($x_{min}$) means a minimum value of the ZrHf content ratio in a region where the ZrHf content ratio at each measurement point is continuously equal to or less than the value of the average ZrHf content ratio $x_{av}$ of the total content of Zr and Hf to the total content of Ti, Zr, and Hf in the composition formula $(Ti_{(1-x)}Zr_{xy}Hf_{x(1-y)})(N_{(1-z)}C_z)$ of the entire layer. In a case where there are a plurality of regions where the ZrHf content ratio is continuously equal to or less than the value of the $x_{av}$, a minimum value of the ZrHf content ratio in each region is defined as the minimum ZrHf content ratio ($x_{min}$), and a position of each region where the ZrHf content ratio is the minimum value is defined as the minimum ZrHf content point in each region. Hereinafter, the minimum ZrHf content ratio may be referred to as $x_{min}$.

According to the above definition, in a case where there is a cyclic change in the vicinity of the value of the average ZrHf content ratio $x_{av}$, the maximum ZrHf content point and the minimum ZrHf content point appear alternately.

Figure 2:
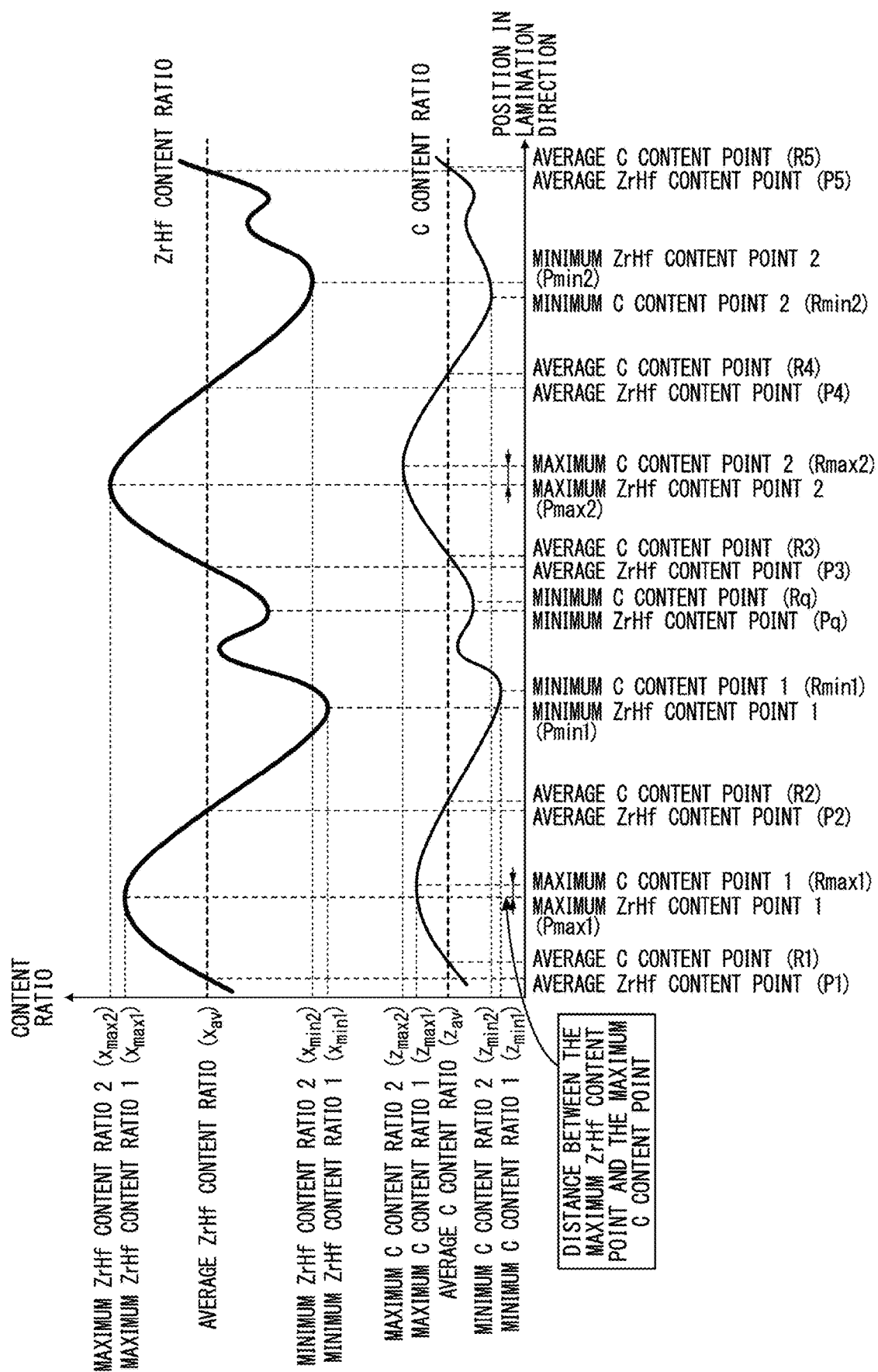
FIG. 2 shows a conceptual diagram showing a relationship between a maximum ZrHf content ratio, a minimum ZrHf content ratio, an average ZrHf content ratio, the maximum C content ratio, the minimum C content ratio, and an average C content ratio, and positions of a maximum ZrHf content point, a minimum ZrHf content point, an average ZrHf content point, the maximum C content point, the minimum C content point, and an average C content point corresponding to the respective content ratios, which will be described after regarding the ZrHf content ratio and the C content ratio in a composition fluctuation direction of the composition fluctuation structure of the TiZrHf complex carbonitride layer of the coated tool of the present invention.

Specifically, it will be described with reference to FIG. 2. In a case where a left side of FIG. 2 is an upper layer position, the ZrHf content ratio changes from the upper portion in the order of the average ZrHf content ratio ($x_{av}$)-maximum ZrHf content ratio 1 ($x_{max}1$)-average ZrHf content ratio ($x_{av}$)-minimum ZrHf content ratio 1 ($x_{min}1$)-average ZrHf content ratio ($x_{av}$)-ZrHf The maximum content ratio 2 ($x_{max2}$)-average ZrHf content ratio ($x_{av}$)-minimum ZrHf content ratio 2 ($x_{min}$ 2) at a position of average ZrHf content point (P1)-maximum ZrHf content point 1 (Pmax1)-average ZrHf content point (P2)-minimum ZrHf content point 1 (Pmin1)-average ZrHf content point (P3)-maximum ZrHf content point 2 (Pmax2)-average ZrHf content point (P4)-minimum ZrHf content point 2 (Pmin2)-average ZrHf content point (P5).

Here, for example, a minimum point that is less than the average ZrHf content ratio ($x_{av}$) continuously appears at two portions of (Pmin1) and (Pq) between the positions of the average ZrHf content point (P2) and the average ZrHf content point (P3), and in this case, from the above definition, the position of (Pmin1) showing the smaller minimum ZrHf content ratio ($x_{min1}$) is defined as the minimum ZrHf content point.

Hereinafter, regarding the Ti component, the C component, and the N component, in the region where the content ratio is continuously equal to or greater than the average content ratio thereof, the position with the maximum value in each region is referred to as a maximum content point in each region, and the position with the minimum value in the region where the content ratio is continuously equal to or less than the value of the average content ratio of each component is referred to as a minimum content point in each region.

2) Definitions of Ti maximum content point, Ti maximum content ratio $\alpha_{max}$, Ti minimum content point, and Ti minimum content ratio $\alpha_{min}$;

In the composition fluctuation structure, the content ratio of a Ti content to the total content of Ti, Zr, and Hf (hereinafter, also referred to as a Ti content ratio) indicates a Ti minimum content ratio $\alpha_{min}$ ($=1-x_{max}$) at the maximum ZrHf content point and indicates a Ti maximum content ratio $\alpha_{max}$ ($=1-x_{min}$) at the minimum ZrHf content point, along a direction in which the cycle width of the cyclic composition change of the ZrHf content ratio is minimized. Here, $\alpha$ represents an atomic ratio.

That is, the Ti content ratio indicates a change in content ratio of Ti minimum content ratio-Ti maximum content ratio-Ti minimum content ratio-Ti maximum content ratio . . . in the same cycle, along the direction in which the cycle width of the cyclic composition change of the ZrHf content ratio is minimized. The definitions of the Ti maximum content point, the Ti maximum content ratio, the Ti minimum content point, and the Ti minimum content ratio referred to here are the same definitions in which ZrHf is replaced with Ti.

3) Definitions of maximum C content point, maximum C content ratio ($z_{max}$), minimum C content point, and minimum C content ratio ($z_{min}$);

In the composition fluctuation structure, the C content ratio has, for example, a predetermined distance of maximum C content ratio-minimum C content ratio-maximum C content ratio-minimum C content ratio . . . along a direction in which cycle widths of the cyclic composition changes of Ti and ZrHf are minimized, and shows a cyclic change of the content ratio.

To describe the maximum C content ratio and the minimum C content ratio herein, the maximum C content ratio means a maximum value of the C content ratio in a portion where the C content ratio at each measurement point is continuously equal to or greater than a value of the average content ratio $z_{av}$ of the C content to the total content of N and C in the composition formula $(Ti_{(1-x)}Zr_{xy}Hf_{x(1-y)})(N_{(1-z)}C_z)$ of the entire layer. In a case where there are a plurality of regions where the C content ratio is continuously equal to or greater than the value of the z, a maximum value of the C content ratio in each region is defined as the maximum C content ratio, and a position of each region where the C content ratio is the maximum value is defined as the maximum C content point in each region. Hereinafter, the maximum C content ratio may be referred to as $z_{max}$.

In the same manner as described above, the minimum C content point means a minimum value of the C content ratio in a region where the C content ratio at each measurement point is continuously equal to or less than a value of the average C content ratio $z_{av}$ of the C content to the total content of N and C in the composition formula $(Ti_{(1-x)}Zr_{xy}Hf_{x(1-y)})(N_{(1-z)}C_z)$ of the entire layer. In a case where there are a plurality of regions where the C content ratio is continuously equal to or less than the value of the z, a minimum value of the C content ratio in each region is defined as the minimum C content ratio, and a position of each region where the C content ratio is the minimum value is defined as the minimum C content point in each region. Hereinafter, the minimum C content ratio may be referred to as $z_{min}$.

According to the above definition, in a case where there is a cyclic change in the vicinity of the value of the average C content ratio $z_{av}$, the maximum content point and the minimum content point appear alternately.

The C content ratio is also specifically shown in FIG. 2 in the same manner as the ZrHf content ratio. In a case where a left side of FIG. 2 is an upper layer position, the C content ratio changes from the upper portion in the order of the average C content ratio $(z_{av})$-maximum C content ratio 1 $(z_{max}1)$-average C content ratio $(z_{av})$-minimum C content ratio 1 $(z_{min1})$-average C content ratio $(z_{av})$-maximum C content ratio 2 $(z_{max2})$-average C content ratio $(z_{av})$-minimum C content ratio 2 $(z_{min2})$ at a position of average C content point (R1)-maximum C content point 1 (Rmax1)-average C content point (R2)-minimum C content point 1 (Rmin1)-average C content point (R3)-maximum C content point 2 (Rmax2)-average C content point (R4)-minimum C content point 2 (Rmin2)-average C content point (R5).

Here, for example, a minimum point that is less than the average C content ratio $(z_{av})$ continuously appears at two portions of (Rmin1) and (Rq) between the positions of the average C content point (R2) and the average C content point (R3), and in this case, from the above definition, the position of (Rmin1) showing the smaller minimum C content ratio $(z_{min1})$ is defined as the minimum C content point.

4) Definitions of N maximum content point, N maximum content ratio $\beta_{max}$, N minimum content point, and N minimum content ratio $\beta_{min}$; In the composition fluctuation structure, the content ratio of an N content to the total content of N and C (hereinafter, also referred to as an N content ratio) indicates an N minimum content ratio $\beta_{min}$ $(=1-z_{max})$ at the maximum C content point and indicates an N maximum content ratio $\beta_{max}$ $(=1-z_{min})$ at the minimum C content point, along a direction in which the cycle width of the cyclic composition change of the C content ratio is minimized. In addition, $\beta$ represents an atomic ratio.

That is, the N content ratio indicates a change in content ratio of N minimum content ratio-N maximum content ratio-N minimum content ratio-N maximum content ratio . . . in the same cycle, along the direction in which the cycle width of the cyclic composition change of the C content ratio is minimized. The definitions of the N maximum content point, the N maximum content ratio, the N minimum content point, and the N minimum content ratio referred to here are the same definitions in which C is replaced with N.

5) ZrHf content ratio difference $(x_{max}-x_{min})$ between maximum ZrHf content point and minimum ZrHf content point and C content ratio difference $(z_{max}-z_{min})$ between maximum C content point and minimum C content point;

The positions of the maximum ZrHf content point and the maximum C content point, and the cycles of the respective maximum content point and the minimum content point can be synchronized in a film forming method which will be described later.

In addition, by having the composition fluctuation structure in which an average value of absolute values of a difference Δx between the maximum ZrHf content ratio $x_{max}$ and the minimum ZrHf content ratio $x_{min}$ is 0.02 or more, and an average value of absolute values of a difference Δz between the maximum C content ratio $z_{max}$ and the minimum C content ratio $z_{min}$ is 0.02 or more, the hardness is improved. The following two points can be considered as factors for improving the hardness.

(1) The hardness can be improved by hindering movement of dislocations between a region where Zr, Hf, and C are increased (enriched region) and a region where Zr, Hf, and C are decreased (poor region).

(2) Since the C content is increased in the region where the contents of Zr and Hf are increased, an "effect of bonding between Zr and N" and an "effect of bonding between Hf and N" are smaller, compared to a uniform TiZrHfNC layer. Since ZrN and HfN has a hardness less than those of ZrC, HfC, TiC, and TiN, the hardness can be improved by reducing the effect of the bonding between Zr and Hf and N.

The difference between the maximum ZrHf content ratio $x_{max}$ and the minimum ZrHf content ratio $x_{min}$ is more preferably 0.02 or more and 0.90 or less, and the difference between the maximum C content ratio $z_{max}$ and the minimum C content ratio $z_{min}$ is more preferably 0.02 or more and 0.75 or less. If these differences are extremely great, the anomalous damage such as minute chipping is likely to occur. Although the reason thereof is not clear, it is surmised that the change in the lattice constant within the composition fluctuation structure is extremely great and a toughness of the crystal grains decreases.

6) Distance (average value) between adjacent maximum ZrHf content point and minimum ZrHf content point;

Regarding the distance between the maximum ZrHf content point and the minimum ZrHf content point, it is necessary that "in the vertical cross-sectional observation of the complex carbonitride layer, an average distance measured in the direction in which the cycle width of the cyclic composition change is minimized is 5 to 100 nm", in order to improve the hardness.

In order to exhibit the effect of improving the hardness, the average distance is desirably small and necessarily 100 nm or less. On the other hand, in a case where the average distance is less than 5 nm, it is difficult to clearly distinguish and form each of them. Accordingly, the desired hardness cannot be obtained and the wear resistance cannot be ensured.

For example, in FIG. 2, the average value of the distance (Pmin1-Pmax1) between the maximum ZrHf content point 1 (Pmax1) and the minimum ZrHf content point 1 (Pmin1) and the distance (Pmin2-Pmax2) between the maximum ZrHf content point 2 (Pmax2) and the minimum ZrHf content point 2 (Pmin2) can be obtained.

7) Average value of distance between maximum ZrHf content point and maximum C content point at position closest to maximum ZrHf content point;

In order to exhibit the effect of improving the hardness (effect of the section (2) in paragraph 0020), "the average value of the distance between the maximum ZrHf content point and the maximum C content point at a position closest to the maximum ZrHf content point" is preferably small, and is necessarily ⅕ or less of the average distance between the adjacent maximum ZrHf content point and minimum ZrHf content point.

As described above, it is considered that "the average value of the distance between the maximum ZrHf content point and the maximum C content point at a position closest to the maximum ZrHf content point" is preferably small, but by the method disclosed in the present invention, it is confirmed that the effect is exhibited, even in a case where the average value of the distance between the maximum ZrHf content point and the maximum C content point at a position closest to the maximum ZrHf content point is 1/160 of the average distance between the maximum ZrHf content point and the minimum ZrHf content point adjacent thereto.

Regarding the average value of the distance between the maximum ZrHf content point and the maximum C content point at a position closest to the maximum ZrHf content point, for example, in FIG. 2, the average value of the distance (Rmax1-Pmax1) between the maximum ZrHf content point 1 (Pmax1) and the maximum C content point 1 (Rmax1) at a position closest to the maximum ZrHf content point 1 (Pmax1), and the distance (Rmax2-Pmax2) between the maximum ZrHf content point 2 (Pmax2) and the maximum C content point 2 (Rmax2) at a position closest to the maximum ZrHf content point 2 (Pmax2) can be obtained.

By comparing this value with 1/5 of the distance (average value) between the adjacent maximum ZrHf content point and minimum ZrHf content point, that is, the average value of the distance (Pmin1-Pmax1) between the maximum ZrHf content point 1 (Pmax1) and the minimum ZrHf content point 1 (Pmin1) and the distance (Pmin2-Pmax2) between the maximum ZrHf content point 2 (Pmax2) and the minimum ZrHf content point 2 (Pmin2), the presence or absence of the effect can be determined.

8) Area ratio of composition fluctuation structure to structure of complex carbonitride layer;

In order to exhibit the effect of improving the hardness, it is preferable that the area ratio of the composition fluctuation structure to the structure of the complex carbonitride layer is great, and in the vertical cross-sectional observation of the complex carbonitride layer, the area ratio of the composition fluctuation structure to the structure of the complex carbonitride layer is necessarily 10% or more.

As described above, it is considered that the "area ratio of the composition fluctuation structure to the structure of the complex carbonitride layer" is preferably great, but by the method disclosed in the present invention, it is confirmed that the effect is exhibited, even in a case where the area ratio of the composition fluctuation structure to the structure of the complex carbonitride layer is 98%.

9) Laminated structure;

In order to further exhibit the effect of improving the hardness, the composition fluctuation structure is preferably a laminated structure. The "laminated structure" here indicates a "structure of the composition fluctuation structure in which only one maximum ZrHf content point or one minimum ZrHf content point is present between adjacent average ZrHf content points, and only one maximum C content point or one minimum C content point is present between adjacent average C content points".

From a viewpoint of improving hardness, it is not necessary that a lamination direction of the laminated structure (direction in which the cycle width of the cyclic composition change is minimized in the vertical cross-sectional observation of the TiZr complex carbonitride layer or the TiZrHf complex carbonitride layer) matches to a film thickness direction. In a case of a film forming method which will be described later, a complex carbonitride layer containing crystal grains having a laminated structure is obtained, but it is not limited that the lamination direction of the laminated structure matches to the film thickness direction.

In addition, there is a case where the structure in the vicinity of the grain boundary is not the laminated structure or a case where any of the elements of Ti, Zr, Hf, C, N, O, and Cl is concentrated in the vicinity of the grain boundary, but as described above, the effect of improving the hardness is exhibited, as long as the area ratio of the composition fluctuation structure (in this case, composition fluctuation structure of the laminated structure) to the structure of the complex carbonitride layer is 10% or more.

(3) Film forming method of complex carbonitride layer (TiZrNC layer or TiZrHfNC layer)

The TiZrNC layer or the TiZrHfNC layer having the component composition specified in the present invention and having a specific composition fluctuation structure can be formed, for example, on a tool body by forming a film using a chemical vapor deposition method under the conditions shown below.

That is, as the film formation conditions of the TiZrNC layer or the TiZrHfNC layer, the layer can be formed by using a $TiCl_4$ gas, a $ZrCl_4$ gas or a $ZrCl_4$ gas+$HfCl_4$ gas, a HCl gas, a $CH_4$ gas, an $N_2$ gas, and a $H_2$ gas as a raw material, at a film forming temperature of 980° C. or higher and lower than 1080° C., a pressure condition of 16 kPa or more and less than 40 kPa, using a CVD apparatus capable of cycle supply.

Specifically, the film is formed by setting a reaction of a gas group A and a gas group B, which have common gas components but different compositions, as a unit cycle, and repeating the reaction in the unit cycle as many times as necessary.

[Film Formation Conditions]
1) Reaction Gas Composition (Volume %):
Gas group A; $TiCl_4$: 0.4 to 0.7%,
$ZrCl_4$: 0.1 to 1.8%, $HfCl_4$: 0.0 to 1.7%,
Here, $ZrCl_4$+$HfCl_4$: 0.5 to 1.8%,
HCl: 0.1 to 0.4%,
$CH_4$: 1.0 to 6.0%,
$N_2$: 25.0 to 60.0%,
$H_2$: Balance,
Gas group B; $TiCl_4$: 0.2 to 0.5%, here, less than $TiCl_4$ concentration of gas group A,
$ZrCl_4$: 0.1 to 2.2%, $HfCl_4$: 0.0 to 2.2%,
Here, $ZrCl_4$+$HfCl_4$: 0.8 to 2.2% here, exceeding the ($ZrCl_4$+$HfCl_4$) concentration of the gas group A
HCl: 0.1 to 0.4%,
$CH_4$: 2.0 to 8.0%, here, exceeding the $CH_4$ concentration of gas group A
$N_2$: 15.0 to 50.0%, here, less than $N_2$ concentration of gas group A
$H_2$: Balance,
2) Supply Cycle:
This is repeated with (gas group A→gas group B) as one cycle.

The supply time of each gas group is five seconds or longer for both the gas group A and the gas group B, and the gas supply time per cycle is ten seconds or longer. In a case where the gas supply time per cycle is shorter than ten seconds, it is difficult to clearly distinguish and form the composition fluctuation structure. Meanwhile, as the gas supply time per cycle is lengthened, the composition fluctuation of the composition fluctuation structure in the crystal grains becomes longer. As a result, the "effect of improving the hardness by hindering movement of dislocations between the region where Zr, Hf, and C are increased and the region where Zr, Hf, and C are decreased" is deteriorated. Accordingly, the hardness is deteriorated. The supply time of each gas group is preferably 90 seconds or shorter for both the gas group A and the gas group B, and the gas supply time per cycle is preferably 180 seconds or shorter. Therefore, the gas supply time per cycle is preferably 10 seconds or longer and 180 seconds or shorter.

The layer thickness of the complex carbonitride layer is adjusted by increasing or decreasing the number of times of repetitions of the gas supply cycle (gas group A→gas group B).

3) Reaction atmosphere temperature: 980° C. or higher and lower than 1080° C.

In a case where a reaction atmosphere temperature is lower than 980° C., a sufficient deposition rate cannot be obtained, and a chlorine content of the TiZrNC layer or the TiZrHfNC layer tends to increase. On the other hand, in a case where the reaction atmosphere temperature is 1080° C. or higher, elements such as C may diffuse into the film from the cemented carbide of the tool body, and sufficient adhesion strength may not be obtained. Therefore, the reaction atmosphere temperature is preferably 980° C. or higher and lower than 1080° C. The reaction atmosphere temperature is more preferably 1010° C. or higher and lower than 1080° C.

4) Reaction atmosphere pressure: 16 kPa or more and less than 40 kPa

In a case where a reaction atmosphere pressure is less than 16 kPa, a sufficient film thickness cannot be obtained, and in a case where the reaction atmosphere pressure is 40 kPa or more, pores are likely to be contained in the film. Therefore, the reaction atmosphere pressure is preferably 16 kPa or more and less than 40 kPa.

(4) Film Forming Method of Lower Layer and Upper Layer

In the present invention, a lower layer can be formed between the tool body and the complex carbonitride layer (TiZrNC layer or TiZrHfNC layer), and an upper layer can be formed on the complex carbonitride layer (TiZrNC layer or TiZrHfNC layer).

Table 3 below can be referred to for the compounds for forming a film and the film formation conditions.

Next, the surface-coated cutting tool of the present invention will be specifically described with reference to examples.

Examples

As raw material powders, WC powder, TiC powder, ZrC powder, TaC powder, NbC powder, $Cr_3C_2$ powder, TiN powder, and Co powder, all of which had an average grain size of 1 to 3 μm, were prepared, and the raw material powders were mixed in blending compositions shown in Table 1. Wax was further added thereto and the mixture was blended in acetone by a ball mill for 24 hours, dried under reduced pressure. Thereafter, the resultant material was press-formed into green compacts having predetermined shapes at a pressure of 98 MPa, and the green compacts were sintered in a vacuum at 5 Pa under the condition that the green compacts were held at a predetermined temperature in a range of 1370° C. to 1470° C. for one hour. After the sintering, tool bodies A to C made of WC based cemented carbide with insert shapes according to ISO standard CNMG120408 were respectively manufactured.

In addition, as raw material powders, a TiCN (TiC/TiN=50/50 in terms of mass ratio) powder, a ZrC powder, a TaC powder, an NbC powder, a $Mo_2C$ powder, a WC powder, a Co powder, and a Ni powder, all of which had an average grain size of 0.5 to 2 μm, were prepared, and the raw material powders were mixed in blending compositions shown in Table 2, were subjected to wet mixing by a ball mill for 24 hours, and were dried. Thereafter, the resultant material was press-formed into green compacts at a pressure of 98 MPa, and the green compacts were sintered in a nitrogen atmosphere at 1.3 kPa under the condition that the green compacts were held at a temperature of 1500° C. for one hour. After the sintering, tool bodies D and E made of TiCN based cermet with insert shapes according to ISO standard CNMG120408 were respectively manufactured.

Subsequently, each of these tool bodies A to E was inserted into a piece of chemical vapor deposition apparatus, and the TiZr complex carbonitride layer or the TiZrHf complex carbonitride layer is formed to manufacture coated tools 1 to 15 of the present invention.

The lower layer and the upper layer were provided as necessary.

(a) The lower layer and the upper layer having a desired layer thickness shown in Table 5 were deposited under the conditions shown in Table 3.

(b) Next, the film formation was performed on the tool body of Table 1 or Table 2 shown in tool body symbol, based on Table 4, under the film formation conditions of the formation symbol of TiZrNC layer/TiZrHfNC layer of the film formation step of the present invention, and an average composition of TiZrNC layer/TiZrHfNC layer, the area ratio of the composition fluctuation structure to the structure of the complex carbonitride layer, the maximum ZrHf content ratio (average value), the minimum ZrHf content ratio (average value), the maximum C content ratio (average value), the minimum C content ratio (average value), the distance (average value) between the maximum ZrHf content point and the minimum ZrHf content point, the distance (average value) between the maximum C content point and the minimum C content point, the distance (average value) between the maximum ZrHf content point and the maximum C content point at a position closest to the maximum ZrHf content point, and the average film thickness of the obtained coated tools 1 to 15 of the present invention are shown in Table 5.

A case where the TiN layer (0.5)+1-TiCN layer (3.0) shown in a lower layer column of Table 5 indicates that a TiN layer of 0.5 μm is formed as a first layer of the lower layer, and an 1-TiCN layer of 3.0 μm is formed as a second layer of the lower layer (the same applies to the upper layer of Table 5 and the lower layer and the upper layer of Table 6 which will be described later).

The 1-TiCN layer refers to a TiCN layer having a vertically elongated crystal structure. (See Note in Table 3)

In addition, for the purpose of comparison, coated tools of 1 to 12 comparative example were respectively manufactured in the same procedure as in the coated tools 1 to 15 of the present invention. That is, (a) The lower layer having a desired layer thickness shown in Table 6 was deposited on the tool body under the conditions shown in Table 3.

(b) Next, the film formation was performed on the tool body of Table 1 or Table 2 shown in tool body symbol, based on Table 4, under the film formation conditions of the formation symbol of TiZrNC layer/TiZrHfNC layer of the film formation step of the comparative example, and an average composition of TiZrNC layer/TiZrHfNC layer, the area ratio of the composition fluctuation structure to the structure of the complex carbonitride layer, the maximum ZrHf content ratio (average value), the minimum ZrHf content ratio (average value), the maximum C content ratio (average value), the minimum C content ratio (average value), the distance (average value) between the maximum ZrHf content point and the minimum ZrHf content point, the distance (average value) between the maximum C content point and the minimum C content point, the distance (average value) between the maximum ZrHf content point and the maximum C content point at a position closest to the maximum ZrHf content point, and the average film thickness of the obtained coated tools 1 to 12 of the comparative examples are shown in Table 6.

Here, an analysis method of the coated tools 1 to 15 of the present invention and the coated tools 1 to 12 of the comparative example will be described.

The measurement of the film thickness was performed using a scanning electron microscope (magnification of 5000). First, polishing was performed so that a cross section in a orthogonal direction to the tool body being exposed at a position away from a cutting edge by 100 μm on a rake face in the vicinity of the cutting edge. Then, the TiZrN layer and the TiZrHfN layer was observed in a visual field at magnification of 5000 so as to include the position away from the edge of the rake face in the vicinity of the cutting edge by 100 μm, layer thicknesses of five points in the observation visual field were measured, and an average value was defined as an average layer thickness.

Then, the ratio (atom %) of chlorine (Cl) to the total content of Ti, Zr, Hf, C, N, O, and Cl was measured at 10 points on the polished surface described above at a position away from the cutting edge of the rake surface in the vicinity of the edge by 90 to 110 μm by using an electron probe micro-analyzer (EPMA). An average value of these 10 points is shown in Tables 5 and 6 as the amount of chlorine.

Next, a vertical cross section orthogonal to the surface of the tool body was cut out using a focused ion beam (FIB), the composition of the TiZrNC layer or the TiZrHfNC layer was analyzed at five different portions in a visual field of 1.0 μm×1.0 μm (in a case where the film thickness of the TiZrNC layer or the TiZrHfNC layer is 1.0 μm or less, visual field of film thickness of TiZrNC layer or the TiZrHfNC layer×1.0 μm) using a high angle scattering annular dark field scanning transmission microscopy (hereinafter, also referred to as "HAADF-STEM") and energy dispersive spectroscopy (EDS), in a visual field set to have a width in a direction parallel to the surface of the tool body of 10 μm along the layer thickness direction thereof and contain the entire thickness region of the hard coating layer, and an average composition of the entire TiZrNC layer or TiZrHfNC layer was obtained from an average value thereof.

Next, HAADF-STEM was used to obtain the area ratio of the composition fluctuation structure to the structure of the complex carbonitride layer. Specifically, in the visual field of 1.0 μm×1.0 μm (in a case where the film thickness of the TiZrNC layer or the TiZrHfNC layer is 1.0 μm or less, visual field of film thickness of TiZrNC layer or the TiZrHfNC layer×1.0 μm), the HAADF-STEM image was observed at five different visual fields, the area ratio of the composition fluctuation structure to the structure of the complex carbonitride layer was obtained in each visual field, and an average value of the composition fluctuation structure in each visual field was defined as the area ratio of the composition fluctuation structure to the structure of the complex carbonitride layer.

A contrast in the HAADF-STEM image is strong due to a difference in atomic weight of constituent elements. Accordingly, it can be surmised that the "structure with cyclic lightness and darkness in the HAADF-STEM image" observed here is a "structure having cyclic composition changes of Ti, Zr and Hf".

Next, it was confirmed whether or not the structure with cyclic lightness and darkness had cyclic composition changes of Ti, Zr, and Hf by using the line analysis method by EDS.

FIG. 1 shows a cross-sectional HAADF-STEM image of a TiZr complex carbonitride layer of a coated tool 5 of the present invention.

According to the HAADF-STEM image of FIG. 1, a plurality of composition fluctuation structures of the laminated structure can be observed in the crystal grains at the left end, for example, the composition fluctuation structure of the uppermost laminated structure including a portion surrounded by the white frame was subjected to EDS line analysis.

First, from the HAADF-STEM image, "the direction in which the cycle widths of the cyclic composition changes of Ti, Zr, and Hf are minimized (that is, the direction in which the cycle width of the contrast between lightness and darkness in the HAADF-STEM image is minimized)" D1 was obtained. FIG. 1 shows a result of obtaining, in a white frame portion of the cross-sectional HAADF-STEM image of the TiZr complex carbonitride layer of the coated tool 5 of the present invention, a direction in which cycles of composition changes of Ti and Zr are minimized (for example, a direction in which a layer thickness of a layer configuring a laminated structure is minimized, in a case where the composition fluctuation structure formed in the crystal grains is a structure having the laminated structure). It is not limited that the lamination direction D1 of the laminated structure matches to a film thickness direction D2.

As described above, in the HAADF-STEM image, the contrast due to the difference in atomic weight of the constituent elements is strong, and in the HAADF-STEM image of FIG. 1, the brighter the portion, the more Zr is contained. In addition, the white frame portion is included in one crystal grain. In a case where the grain boundary cannot be clearly observed by HAADF-STEM, the crystal orientation mapping by the electron diffraction pattern is measured at 10 nm distances at the same portion, the crystal orientation relationship between each measurement point is analyzed, and the orientation difference between the adjacent measurement points (hereinafter, also referred to as "pixel") is measured. In a case where the orientation difference is 5 degrees or more, it is defined as a grain boundary. Then, the region surrounded by the grain boundaries is defined as one crystal grain. However, a pixel that exist independently to have an orientation difference of 5 degrees or more with all adjacent pixels is not treated as crystal grains, and those in which two or more pixels are connected are treated as crystal grains.

By performing a line analysis by EDS in the "direction in which the cycle widths of the cyclic composition change of Ti and Zr and Hf are minimized", a maximum ZrHf content ratio, a minimum ZrHf content ratio, a maximum C content ratio, a minimum C content ratio, a distance between a maximum ZrHf content point and a minimum ZrHf content point, a distance between a maximum C content point and a minimum C content point, and a distance between the maximum ZrHf content point and a maximum C content point at a position closest to the maximum ZrHf content point were measured.

All of these were obtained as the average value of the measured values (10 points for each laminated structure) in the composition fluctuation structure of each laminated structure by performing EDS line analysis on the composition fluctuation structure of five laminated structures.

Tables 5 and 6 show the measured and calculated values.

TABLE 1

| Type | | Co | TiC | ZrC | TaC | NbC | $Cr_3C_2$ | TiN | WC |
|---|---|---|---|---|---|---|---|---|---|
| Tool | A | 6.0 | 0.9 | 0.5 | — | 1.5 | — | 0.9 | Balance |
| body | B | 8.0 | 1.2 | — | — | — | 0.5 | 1.2 | Balance |
| | C | 10.0 | 1.5 | 0.5 | 0.5 | 0.5 | — | 1.5 | Balance |

Blending composition (mass %)

TABLE 2

| Type | | Co | Ni | ZrC | TaC | NbC | $Mo_2C$ | WC | TiCN |
|---|---|---|---|---|---|---|---|---|---|
| Tool | D | 6.0 | 3.0 | 0.5 | — | 4.0 | 9.5 | 25.0 | Balance |
| body | E | 12.0 | 3.0 | — | 1.0 | 4.0 | 9.5 | 10.0 | Balance |

Blending composition (mass %)

TABLE 3

Hard coating layer — Formation condition (pressure and temperature of reaction atmosphere are shown in terms of kPa and ° C., respectively)

| Type | Formation symbol | Target layer | Reaction gas composition (volume %) | Pressure | Temperature |
|---|---|---|---|---|---|
| TiC layer | TiC | Lower layer | $TiCl_4$: 4.2%, $CH_4$: 8.5%, $H_2$: balance | 7 | 1020 |
| TiCN layer | TiCN | Lower layer | $TiCl_4$: 4.2%, $N_2$: 20%, $CH_4$: 4%, $H_2$: balance | 12 | 1020 |
| ZrCN layer | ZrCN | Lower layer | $ZrCl_4$: 5.0%, $N_2$: 20%, $CH_3CN$: 0.6%, $H_2$: balance | 7 | 880 |
| TiN layer | TiN | Lower layer/upper layer | $TiCl_4$: 4.2%, $N_2$: 30%, $H_2$: balance | 20 | 900 |
| l-TiCN layer | l-TiCN | Lower layer/upper layer | $TiCl_4$: 4.2%, $N_2$: 20%, $CH_3CN$: 0.6%, $H_2$: balance | 7 | 880 |
| TiCNO layer | TiCNO | Upper layer | $TiCl_4$: 4.2%, $N_2$: 20%, $CH_3CN$: 0.6%, CO: 0.1%, $H_2$: balance | 7 | 900 |
| α-$Al_2O_3$ layer | α-$Al_2O_3$ | Upper layer | $AlCl_3$: 2.2%, $CO_2$: 6.5%, HCl: 2.2% $H_2S$: 0.2%, $H_2$: balance | 7 | 1000 |
| $\kappa$-$Al_2O_3$ layer | $\kappa$-$Al_2O_3$ | Upper layer | $AlCl_3$: 3.0%, $CO_2$: 5.0%, $H_2S$: 0.3%, $H_2$: balance | 7 | 970 |

Note)
l-TiCN layer is referred to as a TiCN layer having a longitudinal growth crystal structure.

TABLE 4

Formation of complex carbonitride layer (TiZrNC layer or TiZrHfNC layer) — Formation condition of TiZr complex carbonitride layer or TiZrHf complex carbonitride layer

| Step type | Formation symbol | Gas group A composition (volume %) | | | | | | | Supply time (sec) | Pressure (kPa) | Temp. (° C.) | Gas group B composition (volume %) |
|---|---|---|---|---|---|---|---|---|---|---|---|---|
| | | $TiCl_4$ | $ZrCl_4$ | $HfCl_4$ | HCl | $CH_4$ | $N_2$ | $H_2$ | | | | $TiCl_4$ |
| Film formation step of present invention | A | 0.6 | 1.2 | 1.0 | 0.2 | 0.2 | 1.5 | 55.0 Balance | 20.0 | 25 | 1030 | 0.4 |
| | B | 0.4 | 1.2 | 1.2 | 0.0 | 0.2 | 2.0 | 50.0 Balance | 20.0 | 20 | 1060 | 0.3 |
| | C | 0.6 | 1.0 | 0.2 | 0.8 | 0.2 | 2.5 | 50.0 Balance | 50.0 | 30 | 1000 | 0.4 |
| | D | 0.6 | 1.2 | 1.2 | 0.0 | 0.2 | 3.0 | 50.0 Balance | 20.0 | 25 | 1030 | 0.4 |
| | E | 0.6 | 0.6 | 0.5 | 0.1 | 0.3 | 2.0 | 50.0 Balance | 10.0 | 25 | 1000 | 0.4 |
| | F | 0.7 | 0.5 | 0.1 | 0.4 | 0.2 | 1.5 | 50.0 Balance | 75.0 | 25 | 1000 | 0.2 |
| | G | 0.7 | 0.5 | 0.1 | 0.4 | 0.2 | 1.5 | 55.0 Balance | 7.5 | 25 | 1000 | 0.2 |
| | H | 0.4 | 1.0 | 0.2 | 0.8 | 0.2 | 2.0 | 50.0 Balance | 20.0 | 20 | 1060 | 0.3 |
| | I | 0.6 | 1.2 | 1.2 | 0.0 | 0.2 | 3.0 | 50.0 Balance | 10.0 | 25 | 1030 | 0.4 |
| Film formation step of comparative example | a | *1.1 | 0.6 | 0.5 | 0.1 | 0.2 | *8.0 | 45.0 Balance | 20.0 | 25 | 1030 | *0.7 |
| | b | 0.6 | 1.2 | 1.0 | 0.2 | *0.5 | *0.0 | 55.0 Balance | 20.0 | 25 | 1000 | 0.4 |
| | c | *0.1 | 1.2 | 1.0 | 0.2 | 0.2 | 2.0 | 50.0 Balance | 20.0 | 25 | 1030 | *0.0 |
| | d | 0.6 | 1.0 | 0.2 | 0.8 | 0.2 | 2.0 | 50.0 Balance | *125.0 | 30 | 1000 | 0.4 |
| | e | 0.6 | 1.2 | 1.0 | 0.2 | 0.2 | 2.0 | 50.0 Balance | *2.0 | 25 | 1030 | 0.4 |
| | f | 0.6 | 1.2 | 1.0 | 0.2 | 0.2 | 2.0 | 45.0 Balance | 20.0 | 25 | 1030 | 0.4 |
| | g | * The film is formed with the gas composition of "$TiCl_4$ gas: 0.6%, $ZrCl_4$ gas: 1.5%, $HfCl_4$ gas: 0.3%, HCl gas: 0.2%, $CH_4$ gas: 2.0%, $N_2$ gas: 45.0%, $H_2$ gas: balance" by the CVD method without cycle supply at 25 kPa and 1030° C. | | | | | | | | | | |
| | h | * The TiZrNC film is formed by a magnetron sputtering method. | | | | | | | | | | |

TABLE 4-continued

| Formation of complex carbonitride layer (TiZrNC layer or TiZrHfNC layer) | | Formation condition of TiZr complex carbonitride layer or TiZrHf complex carbonitride layer | | | | | | | | | Gas supply time per cycle (sec) |
|---|---|---|---|---|---|---|---|---|---|---|---|
| | | Gas group B | | | | | | | | | |
| | | Gas group B composition (volume %) | | | | | | Reaction condition | | | |
| | | ZrCl$_4$ + HfCl$_4$ | | | | | | Supply time (sec) | Pressure (kPa) | Temp. (° C.) | |
| Step type | Formation symbol | ZrCl$_4$ | HfCl$_4$ | HCl | CH$_4$ | N$_2$ | H$_2$ | | | | |
| Film formation step of present invention | A | 1.8 | 1.5 | 0.3 | 0.2 | 2.5 | 35.0 | Balance | 20.0 | 25 | 1030 | 40.0 |
| | B | 2.0 | 1.8 | 0.0 | 0.2 | 4.0 | 25.0 | Balance | 20.0 | 20 | 1060 | 40.0 |
| | C | 1.5 | 0.3 | 1.2 | 0.2 | 5.0 | 25.0 | Balance | 50.0 | 30 | 1000 | 100.0 |
| | D | 1.8 | 1.8 | 0.0 | 0.2 | 6.0 | 25.0 | Balance | 20.0 | 25 | 1030 | 40.0 |
| | E | 1.2 | 1.0 | 0.2 | 0.3 | 4.0 | 25.0 | Balance | 10.0 | 25 | 1000 | 20.0 |
| | F | 2.0 | 0.4 | 1.6 | 0.2 | 7.5 | 15.0 | Balance | 75.0 | 25 | 1000 | 150.0 |
| | G | 2.0 | 0.4 | 1.6 | 0.2 | 7.5 | 15.0 | Balance | 7.5 | 25 | 1000 | 15.0 |
| | H | 1.5 | 0.3 | 1.2 | 0.2 | 4.0 | 25.0 | Balance | 20.0 | 20 | 1060 | 40.0 |
| | I | 1.8 | 1.8 | 0.0 | 0.2 | 6.0 | 25.0 | Balance | 10.0 | 25 | 1030 | 20.0 |
| Film formation step of comparative example | a | 1.2 | 1.0 | 0.2 | 0.2 | *12.0 | 20.0 | Balance | 20.0 | 25 | 1030 | 40.0 |
| | b | 1.8 | 1.5 | 0.3 | *0.5 | *0.4 | 30.0 | Balance | 20.0 | 25 | 1000 | 40.0 |
| | c | 1.8 | 1.5 | 0.3 | 0.2 | 4.0 | 25.0 | Balance | 20.0 | 25 | 1030 | 40.0 |
| | d | 1.5 | 0.3 | 1.2 | 0.2 | 4.0 | 25.0 | Balance | *125.0 | 30 | 1000 | *250.0 |
| | e | 1.8 | 1.5 | 0.3 | 0.2 | 4.0 | 25.0 | Balance | *2.0 | 25 | 1030 | *4.0 |
| | f | 1.8 | 1.5 | 0.3 | 0.2 | *2.0 | *45.0 | Balance | 20.0 | 25 | 1030 | 40.0 |
| | g | * The film is formed with the gas composition of "TiCl$_4$ gas: 0.6%, ZrCl$_4$ gas: 1.5%, HfCl$_4$ gas: 0.3%, HCl gas: 0.2%, CH$_4$ gas: 2.0%, N$_2$ gas: 45.0%, H$_2$ gas: balance" by the CVD method without cycle supply at 25 kPa and 1030° C. | | | | | | | | | | |
| | h | * The TiZrNC film is formed by a magnetron sputtering method. | | | | | | | | | | |

*indicates that the film formation conditions are not satisfied.

TABLE 5

| | | | | Hard coating layer | | | | | | |
|---|---|---|---|---|---|---|---|---|---|---|
| | | | | TiZr complex carbonitride layer or TiZrHf complex carbonitride layer | | | | | | |
| | | | | Average composition (atomic ratio) | | | | | | |
| | | Lower layer (number in bracket indicates target average layer thickness (μm)) | | Average composition of each metal element in all metal elements | | | | Average composition of each element in C + N element | | Atom % of Cl content is 0.001 or more and 0.030 or less |
| Type | Tool body symbol | | Formation symbol | Ti (1 − x) | Zr (xy) | Hf x(1 − y) | [(Zr + Hf)/(Ti + Zr + Hf)](x) 0.10 ≤ x ≤ 0.90 | [Zr/ (Zr + Hf)] (y) 0 ≤ y ≤ 1.00 | [C/ (C + N)](z) 0.08 ≤ z ≤ 0.60 | [N/(C + N)](1 − z) 0.40 ≤ (1 − z) ≤ 0.92 | |
| Coated tool of present invention | 1 | A | TiN layer (0.5) + l-TiCN layer (3.0) | A | 0.68 | 0.27 | 0.05 | 0.32 | 0.84 | 0.11 | 0.89 | 0.006 |
| | 2 | B | TiN layer (0.5) + l-TiCN layer (3.0) | A | 0.69 | 0.26 | 0.05 | 0.31 | 0.84 | 0.10 | 0.90 | 0.006 |
| | 3 | B | TiN layer (0.5) + l-TiCN layer (3.0) | B | 0.17 | 0.83 | 0.00 | 0.83 | 1.00 | 0.37 | 0.63 | 0.003 |
| | 4 | B | TiN layer (0.5) + l-TiCN layer (3.0) | C | 0.70 | 0.06 | 0.24 | 0.30 | 0.20 | 0.36 | 0.64 | 0.010 |
| | 5 | B | TiN layer (0.5) + l-TiCN layer (3.0) | D | 0.69 | 0.31 | 0.00 | 0.31 | 1.00 | 0.53 | 0.47 | 0.006 |
| | 6 | B | TiN layer (0.5) + l-TiCN layer (3.0) | E | 0.84 | 0.13 | 0.03 | 0.16 | 0.81 | 0.30 | 0.70 | 0.023 |

TABLE 5-continued

| | | | | | | | | | | | |
|---|---|---|---|---|---|---|---|---|---|---|---|
| | 7 | C | TiN layer (0.5) + l-TiCN layer (3.0) | D | 0.69 | 0.31 | 0.00 | 0.31 | 1.00 | 0.52 | 0.48 | 0.006 |
| | 8 | D | TiN layer (0.5) | D | 0.68 | 0.32 | 0.00 | 0.32 | 1.00 | 0.54 | 0.46 | 0.006 |
| | 9 | E | TiN layer (0.5) + ZrCN layer (3.0) | D | 0.69 | 0.31 | 0.00 | 0.31 | 1.00 | 0.52 | 0.48 | 0.005 |
| | 10 | C | TiC layer (0.5) + TiCN layer (1.0) | D | 0.69 | 0.31 | 0.00 | 0.31 | 1.00 | 0.53 | 0.47 | 0.007 |
| | 11 | B | TiN layer (0.5) + l-TiCN layer (3.0) | F | 0.45 | 0.11 | 0.44 | 0.55 | 0.20 | 0.42 | 0.58 | 0.005 |
| | 12 | B | TiN layer (0.5) + l-TiCN layer (3.0) | G | 0.46 | 0.11 | 0.43 | 0.54 | 0.20 | 0.40 | 0.60 | 0.006 |
| | 13 | B | TiN layer (0.5) + l-TiCN layer (3.0) | H | 0.18 | 0.17 | 0.65 | 0.82 | 0.21 | 0.36 | 0.64 | 0.002 |
| | 14 | B | TiN layer (0.5) + l-TiCN layer (3.0) | B | 0.17 | 0.83 | 0.00 | 0.83 | 1.00 | 0.37 | 0.63 | 0.003 |
| | 15 | B | TiN layer (0.5) + l-TiCN layer (3.0) | I | 0.68 | 0.32 | 0.00 | 0.32 | 1.00 | 0.53 | 0.47 | 0.007 |

| | | Hard coating layer | | | | | | | |
|---|---|---|---|---|---|---|---|---|---|
| | | TiZr complex carbonitride layer or TiZrHf complex carbonitride layer | | | | | | | |
| Type | | Area ratio of composition fluctuation structure in structure of complex carbonitride layer | Maximum content ratio (average value) Zr + Hf (Xmax) | Maximum content ratio (average value) C (Zmax) | Minimum content ratio (average value) Zr + Hf (Xmin) | Minimum content ratio (average value) C (Zmin) | Spacing between ZrHf maximum content point and ZrHf minimum content point (nm) (average value) | Spacing between C maximum content point and C minimum content point (nm) (average value) | Spacing between ZrHf maximum content point and C maximum content point at position closest to ZrHf maximum content point (nm) (average value) | Average layer thickness (µm) | Upper layer (number in bracket indicates target average layer thickness (µm)) |
| Coated tool of present invention | 1 | 60 | 0.46 | 0.20 | 0.23 | 0.03 | 11 | 11 | 0.8 | 1.0 | TiCNO layer (0.5) + Ƙ-Al$_2$O$_3$ layer (1.5) |
| | 2 | 57 | 0.45 | 0.20 | 0.23 | 0.02 | 13 | 13 | 1.0 | 3.0 | TiCNO layer (0.5) + α-Al$_2$O$_3$ layer (1.5) |
| | 3 | 23 | 0.95 | 0.47 | 0.74 | 0.28 | 15 | 15 | 0.6 | 3.0 | TiCNO layer (0.5) + α-Al$_2$O$_3$ layer (1.5) |
| | 4 | 85 | 0.50 | 0.48 | 0.18 | 0.22 | 71 | 71 | 1.0 | 3.0 | TiCNO layer (0.5) + α-Al$_2$O$_3$ layer (1.5) |
| | 5 | 43 | 0.47 | 0.62 | 0.21 | 0.45 | 12 | 12 | 1.1 | 3.0 | TiCNO layer (0.5) + α-Al$_2$O$_3$ layer (1.5) |
| | 6 | 16 | 0.20 | 0.45 | 0.09 | 0.18 | 7 | 7 | 0.3 | 3.0 | TiCNO layer (0.5) + α-Al$_2$O$_3$ layer (1.5) |
| | 7 | 45 | 0.47 | 0.62 | 0.21 | 0.45 | 11 | 11 | 1.0 | 3.0 | TiN layer (0.5) + l-TiCN layer (2.0) |

TABLE 5-continued

| | 8 | 42 | 0.47 | 0.64 | 0.21 | 0.46 | 13 | 13 | 0.5 | 3.0 | 1-TiCN layer (2.0) + α-Al$_2$O$_3$ layer (1.5) |
| --- | --- | --- | --- | --- | --- | --- | --- | --- | --- | --- | --- |
| | 9 | 41 | 0.47 | 0.62 | 0.21 | 0.44 | 12 | 12 | 0.4 | 3.0 | 1-TiCN layer (2.0) + α-Al$_2$O$_3$ layer (1.6) |
| | 10 | 43 | 0.48 | 0.63 | 0.21 | 0.45 | 12 | 12 | 0.7 | 18.0 | — |
| | 11 | 98 | 0.93 | 0.82 | 0.08 | 0.12 | 96 | 96 | 1.5 | 3.0 | TiCNO layer (0.5) + α-Al$_2$O$_3$ layer (1.5) |
| | 12 | 15 | 0.62 | 0.45 | 0.48 | 0.36 | 6 | 6 | 0.2 | 3.0 | TiCNO layer (0.5) + α-Al$_2$O$_3$ layer (1.5) |
| | 13 | 24 | 0.93 | 0.47 | 0.75 | 0.27 | 16 | 16 | 0.1 | 3.0 | TiCNO layer (0.5) + α-Al$_2$O$_3$ layer (1.5) |
| | 14 | 23 | 0.95 | 0.47 | 0.74 | 0.28 | 15 | 15 | 0.6 | 3.0 | TiCNO layer (0.5) + κ-Al$_2$O$_3$ layer (1.5) |
| | 15 | 18 | 0.35 | 0.55 | 0.29 | 0.51 | 6 | 6 | 0.9 | 3.0 | TiCNO layer (0.5) + α-Al$_2$O$_3$ layer (1.5) |

TABLE 6

| | | | | Hard coating layer | | | | | | |
| --- | --- | --- | --- | --- | --- | --- | --- | --- | --- | --- |
| | | | | TiZr complex carbonitride layer or TiZrHf complex carbonitride layer | | | | | | |
| | | | | Average composition of each metal element in all metal elements | | | | Average composition of each element in C + N element | | |
| Type | | Tool body symbol | Lower layer (number in bracket indicates target average layer thickness (μm)) | Formation symbol | Ti (1 − x) | Zr (xy) | Hf x(1 − y) | [(Zr + Hf)/ (Ti + Zr + Hf)] (x) 0.10 ≤ x ≤ 0.90 | Zr/ (Zr + Hf)] (y) 0 ≤ y ≤ 1.00 | [C/ (C + N)] (z) 0.08 ≤ z ≤ 0.60 | [N/ (C + N)] (1 − z) 0.40 ≤ (1 − z) ≤ 0.92 | Atom % of Cl content is 0.001 or more and 0.030 or less |
| Coated tool of comparative example | 1 | B | TiN layer (0.5) + 1-TiCN layer (3.0) | a | *0.93 | 0.06 | 0.01 | *0.07 | 0.86 | *0.70 | *0.30 | 0.007 |
| | 2 | B | TiN layer (0.5) + 1-TiCN layer (3.0) | b | 0.69 | 0.26 | 0.05 | 0.31 | 0.84 | *0.06 | *0.94 | 0.015 |
| | 3 | B | TiN layer (0.5) + 1-TiCN layer (3.0) | c | *0.08 | 0.77 | 0.15 | *0.92 | 0.84 | 0.35 | 0.65 | 0.003 |
| | 4 | B | TiN layer (0.5) + 1-TiCN layer (3.0) | d | 0.71 | 0.06 | 0.23 | 0.29 | 0.21 | 0.35 | 0.65 | 0.009 |
| | 5 | B | TiN layer (0.5) + 1-TiCN layer (3.0) | e | 0.67 | 0.27 | 0.06 | 0.33 | 0.82 | 0.34 | 0.66 | 0.007 |
| | 6 | B | TiN layer (0.5) + 1-TiCN layer (3.0) | f | 0.67 | 0.27 | 0.06 | 0.33 | 0.82 | 0.33 | 0.67 | 0.006 |

TABLE 6-continued

|   |   |   | Layer | | | | | | | | |
|---|---|---|---|---|---|---|---|---|---|---|---|
| 7 | B | TiN layer (0.5) + 1-TiCN layer (3.0) | g | 0.67 | 0.27 | 0.06 | 0.33 | 0.82 | 0.34 | 0.66 | 0.007 |
| 8 | B | TiN layer (0.5) + 1-TiCN layer (3.0) | h | 0.75 | 0.25 | 0.00 | 0.25 | 1.00 | 0.15 | 0.85 | *0.000 |
| 9 | C | TiN layer (0.5) + 1-TiCN layer (3.0) | a | *0.93 | 0.06 | 0.01 | *0.07 | 0.86 | *0.70 | *0.30 | 0.007 |
| 10 | C | TiN layer (0.5) + 1-TiCN layer (3.0) | b | 0.69 | 0.26 | 0.05 | 0.31 | 0.84 | *0.06 | *0.94 | 0.015 |
| 11 | C | TiN layer (0.5) + 1-TiCN layer (3.0) | c | *0.08 | 0.77 | 0.15 | *0.92 | 0.84 | 0.35 | 0.65 | 0.003 |
| 12 | C | TiN layer (0.5) + 1-TiCN layer (3.0) | h | 0.75 | 0.25 | 0.00 | 0.25 | 1.00 | 0.15 | 0.85 | *0.000 |

| | | Hard coating layer TiZr complex carbonitride layer or TiZrHf complex carbonitride layer | | | | | | | | |
|---|---|---|---|---|---|---|---|---|---|---|
| Type | | Area ratio of composition fluctuation structure in structure of complex carbonitride layer | Maximum content ratio (average value) Zr + Hf (Xmax) | Maximum content ratio (average value) C (Zmax) | Minimum content ratio (average value) Zr + Hf (Xmin) | Minimum content ratio (average value) C (Zmin) | Spacing between ZrHf maximum content point and ZrHf minimum content point (nm) (average value) | Spacing between C maximum content point and C minimum content point (nm) (average value) | Spacing between ZrHf maximum content point and C maximum content point at position closest to ZrHf maximum content point (nm) (average value) | Average layer thickness (μm) | Upper layer (number in bracket indicates target average layer thickness (μm)) |
| Coated tool of comparative example | 1 | 31 | 0.14 | 0.83 | 0.02 | 0.60 | 15 | 15 | 0.7 | 3.0 | TiCNO layer (0.5) + α-Al$_2$O$_3$ layer (1.5) |
|  | 2 | 26 | 0.44 | 0.15 | 0.23 | 0.02 | 8 | 8 | 0.2 | 3.0 | TiCNO layer (0.5) + α-Al$_2$O$_3$ layer (1.5) |
|  | 3 | 28 | 0.99 | 0.48 | 0.85 | 0.24 | 14 | 14 | 0.4 | 3.0 | TiCNO layer (0.5) + α-Al$_2$O$_3$ layer (1.5) |
|  | 4 | 91 | 0.51 | 0.49 | 0.16 | 0.20 | *148 | *148 | 1.2 | 3.0 | TiCNO layer (0.5) + α-Al$_2$O$_3$ layer (1.5) |
|  | 5 | *0 | — | — | — | — | — | — | — | 3.0 | TiCNO layer (0.5) + α-Al$_2$O$_3$ layer (1.5) |
|  | 6 | 33 | 0.45 | — | 0.22 | — | 16 | — | — | 3.0 | TiCNO layer (0.5) + α-Al$_2$O$_3$ layer (1.5) |
|  | 7 | *0 | — | — | — | — | — | — | — | 3.0 | TiCNO layer (0.5) + α-Al$_2$O$_3$ layer (1.5) |
|  | 8 | *0 | — | — | — | — | — | — | — | 3.0 | TiCNO layer (0.5) + α-Al$_2$O$_3$ layer (1.5) |
|  | 9 | 31 | 0.14 | 0.83 | 0.02 | 0.60 | 15 | 15 | 0.7 | 3.0 | TiCNO layer (0.5) + α-Al$_2$O$_3$ layer (1.5) |
|  | 10 | 26 | 0.44 | 0.15 | 0.23 | 0.02 | 8 | 8 | 0.2 | 3.0 | TiCNO layer (0.5) + α-Al$_2$O$_3$ layer (1.5) |

TABLE 6-continued

| | | | | | | | | | | |
|---|---|---|---|---|---|---|---|---|---|---|
| 11 | 28 | 0.99 | 0.48 | 0.85 | 0.24 | 14 | 14 | 0.4 | 3.0 | TiCNO layer (0.5) + ϰ-Al$_2$O$_3$ layer (1.5) |
| 12 | *0 | — | — | — | — | — | — | — | 3.0 | TiCNO layer (0.5) + ϰ-Al$_2$O$_3$ layer (1.5) |

*shows that the number is beyond the range of claims.
"—" shows that it cannot be defined since there is no cyclic composition change.

Next, in a state in which each of the various coated tools was clamped to a tip portion of a cutting tool made of tool steel by a fixing jig, the coated tools 1 to 15 of the present invention and the coated tools 1 to 12 of comparative example were subjected to a high feed cutting test of precipitation hardening stainless steel shown below, a wear width of flank face of the cutting edge was measured, and presence or absence of the occurrence of welding was observed. The results are shown in Table 7.

«Cutting Condition A»
Cutting test: wet continuous high feed cutting test of a round bar of precipitation hardening stainless steel
  Work material: JIS/SUS630
  Cutting speed: 120 m/min,
  Depth of cut: 1.5 mm,
  Feed rate: 0.43 mm/rev,
  Cutting time: 5.0 minutes, «Cutting Condition B»
Cutting test: wet intermittent high feed cutting test of precipitation hardening stainless steel having 1 groove
  Work material: JIS/SUS630
  Cutting speed: 90 m/min,
  Depth of cut: 1.0 mm,
  Feed rate: 0.38 mm/rev,
  Cutting time: 2.0 minutes, As clearly shown from the results of the cutting test of Table 7, the coated tool of the present invention contains a desired amount of chlorine shown in Table 5, the ZrHf content ratio and the C content ratio change in cycles, and the TiZr complex carbonitride layer or the TiZrHf complex carbonitride layer having the composition fluctuation structure of the laminated structure in which the cycles and positions of the maximum ZrHf content point and the maximum C content point are synchronized with each other is obtained. Accordingly, for example, during the high feed cutting of the precipitation hardening stainless steel, peeling and chipping do not occur, a flank face maximum wear width is small, and exceptional welding resistance, plastic deformation resistance, and anomalous damage resistance are exhibited.

On the other hand, in the coated tools of the comparative examples, the complex carbonitride layer contained as the hard coating layer does not satisfy a desired average composition, or even in a case where the desired average composition is satisfied, the composition fluctuation structure in which the ZrHf content ratio and the C content ratio change in cycles is not obtained. Accordingly, the desired properties cannot be exhibited, and lifetime was reached at an early stage due to a progress of wear, occurrence of welding, occurrence of chipping, and the like.

TABLE 7

| | | Cutting test result | | | | | | Cutting test result | | | |
|---|---|---|---|---|---|---|---|---|---|---|---|
| | | Cutting condition A | | Cutting condition B | | | | Cutting condition A | | Cutting condition B | |
| Type | | Presence or absence of peeling/ chipping occurrence | Maximum flank wear width (nm) | Presence or absence of peeling/ chipping occurrence | Maximum flank wear width (nm) | Type | | Presence or absence of peeling/ chipping occurrence | Maximum flank wear width (nm) | Presence or absence of peeling/ chipping occurrence | Maximum flank wear width (nm) |
| Coated tool of present invention | 1 | Absent | 0.11 | Absent | 0.16 | Coated tool of comparative example | 1 | ✗1.0 | — | ✗0.3 | — |
| | 2 | Absent | 0.08 | Absent | 0.13 | | 2 | ✗✗3.3 | — | ✗✗0.8 | — |
| | 3 | Absent | 0.15 | Absent | 0.15 | | 3 | ✗✗3.7 | — | ✗✗1.0 | — |
| | 4 | Absent | 0.12 | Absent | 0.17 | | 4 | ✗✗3.0 | — | ✗✗1.0 | — |
| | 5 | Absent | 0.13 | Absent | 0.15 | | 5 | ✗✗2.2 | — | ✗✗0.9 | — |
| | 6 | Absent | 0.09 | Absent | 0.16 | | 6 | ✗✗1.9 | — | ✗✗0.7 | — |
| | 7 | Absent | 0.14 | Absent | 0.12 | | 7 | ✗✗2.4 | — | ✗✗0.8 | — |
| | 8 | Absent | 0.13 | Absent | 0.14 | | 8 | ✗✗2.6 | — | ✗✗1.7 | — |
| | 9 | Absent | 0.17 | Absent | 0.14 | | 9 | ✗✗2.1 | — | ✗✗0.9 | — |
| | 10 | Absent | 0.10 | Absent | 0.17 | | 10 | ✗✗2.5 | — | ✗✗1.1 | — |
| | 11 | Absent | 0.13 | Absent | 0.12 | | 11 | ✗✗2.3 | — | ✗✗1.1 | — |
| | 12 | Absent | 0.15 | Absent | 0.18 | | 12 | ✗✗2.8 | — | ✗✗1.0 | — |
| | 13 | Absent | 0.10 | Absent | 0.17 | | | | | | | |
| | 14 | Absent | 0.11 | Absent | 0.13 | | | | | | | |
| | 15 | Absent | 0.20 | Absent | 0.21 | | | | | | | |

The mark ✗ in "Presence or absence of peeling/chipping occurrence" shows peeling occurred on the hard coating layer, and the mark ✗✗ shows cutting time (min) until the usage life time (maximum flank wear width of 0.30 mm or more) ends due to chipping occurred on the hard coating layer.
The mark "—" in "Maximum flank wear width" shows that the maximum flank wear width after the processing or during lifetime is 0.30 mm or more.

INDUSTRIAL APPLICABILITY

As described above, the coated tool of the present invention has, for example, a desired composition fluctuation structure in which the content ratio of each component changes in cycles in the complex carbonitride layer included as the hard coating layer. Accordingly, for example, during the high feed cutting of the precipitation hardening stainless steel, exceptional welding resistance, chipping resistance, and wear resistance are exhibited. Therefore, the high performance of the cutting equipment, labor saving, energy saving, and cost saving on the cutting operation are sufficiently satisfied.

REFERENCE SIGNS LIST

D1: Direction in which cycles of composition changes of Ti and Zr are minimized in white frame
D2: Film thickness direction

What is claimed is:

1. A surface-coated cutting tool comprising:
a tool body; and
a hard coating layer formed on a surface of the tool body, wherein
(a) the hard coating layer includes at least one layer of a TiZr complex carbonitride layer or a TiZrHf complex carbonitride layer having an average layer thickness of 0.5 to 20.0 μm,
(b) the complex carbonitride layer contains TiZr complex carbonitride or TiZrHf complex carbonitride, and in a case where the complex carbonitride is represented by a composition formula $(Ti_{(1-x)}Zr_{xy}Hf_{x(1-y)})(N_{(1-z)}C_z)$,
the complex carbonitride layer has an average composition in which a content ratio x of a total content of Zr and Hf to a total content of Ti, Zr, and Hf, a content ratio y of a Zr content to the total content of Zr and Hf, and a content ratio z of a C content to a total content of N and C (here, all of x, y, and z are atomic ratios) satisfy $0.10 \leq x \leq 0.90$, $0 < y \leq 1.0$, and $0.08 < z < 0.60$, respectively,
the complex carbonitride layer contains chlorine in an average chlorine content of 0.001 atom % or more and 0.030 atom % or less,
(c) the complex carbonitride layer has a composition fluctuation structure in which the content ratio of the total content of Zr and Hf to the total content of Ti, Zr, and Hf and the content ratio of the C content to the total content of N and C change in cycles in at least some crystal grains,
(c-1) in longitudinal cross section observation, an area ratio of the composition fluctuation structure occupying a structure of the complex carbonitride layer is 10% or more,
(c-2) regarding the content ratio of the total content of Zr and Hf to the total content of Ti, Zr, and Hf in the composition fluctuation structure, a maximum ZrHf content point showing a maximum content ratio $x_{max}$ and a minimum ZrHf content point showing a minimum content ratio $x_{min}$ are repeated, an average distance which is an average value of distances between the repeated maximum ZrHf content point and the minimum ZrHf content point adjacent to each other is 5 to 71 nm, and an average value of absolute values of differences $\Delta x$ between the maximum content ratio $x_{max}$ of the maximum ZrHf content point and the minimum content ratio $x_{min}$ of the minimum ZrHf content point is 0.06 to 0.32,
(c-3) regarding the content ratio of the C content to the total content of N and C in the composition fluctuation structure, a maximum C content point showing a maximum content ratio $z_{max}$ and a minimum C content point showing a minimum content ratio $z_{min}$ are repeated, an average distance which is an average value of distances between the repeated maximum C content point and the minimum C content point adjacent to each other is 5 to 71 nm, and an average value of absolute values of differences $\Delta z$ between the maximum content ratio $z_{max}$ of the maximum C content point and the minimum C content ratio $z_{min}$ is 0.02 or more, and
(c-4) cycles and positions of the maximum ZrHf content point showing the maximum content ratio $x_{max}$ and the minimum ZrHf content point showing the minimum content ratio $x_{min}$, regarding the content ratio of the total content of Zr and Hf to the total content of the Ti, Zr, and Hf in the composition fluctuation structure, are respectively synchronized with cycles and positions of the maximum C content point showing the maximum content ratio $z_{max}$ and the minimum C content point showing the minimum content ratio $z_{min}$, regarding the content ratio of the C content to the total content of N and C, and an average value of a distance between the maximum ZrHf content point and the maximum C content point at a position closest to the maximum ZrHf content point is ⅕ or less of the average distance between the maximum ZrHf content point and the adjacent minimum ZrHf content point.

2. The surface-coated cutting tool according to claim 1, wherein the composition fluctuation structure is a laminated structure.

* * * * *